(12) United States Patent
Tzeng

(10) Patent No.: US 6,482,520 B1
(45) Date of Patent: Nov. 19, 2002

(54) THERMAL MANAGEMENT SYSTEM

(76) Inventor: Jing Wen Tzeng, 3622 Lennox Cir., Brunswick, OH (US) 44212

( * ) Notice: Subject to any disclaimer, the term of this patent is extended or adjusted under 35 U.S.C. 154(b) by 0 days.

(21) Appl. No.: 09/513,001

(22) Filed: Feb. 25, 2000

(51) Int. Cl.$^7$ ................................. B32B 9/00
(52) U.S. Cl. ...................... 428/408; 428/131; 361/709; 165/905; 165/907; 257/712; 257/722; 423/414; 423/445 R; 423/448
(58) Field of Search ................................. 428/131, 408; 361/709; 165/905, 907; 257/712, 722; 423/414, 445 R, 448

(56) References Cited

U.S. PATENT DOCUMENTS

| | | | |
|---|---|---|---|
| 3,404,061 A | 10/1968 | Shane et al. ................ 161/125 |
| 4,878,152 A | * 10/1989 | Sauzade et al. | |
| 4,895,713 A | 1/1990 | Greinke et al. ............. 423/448 |
| 5,523,260 A | 6/1996 | Missele ....................... 437/209 |
| 5,582,781 A | 12/1996 | Hayward ..................... 264/28 |
| 5,902,762 A | 5/1999 | Mercuri et al. ................ 501/99 |
| 6,027,807 A | * 2/2000 | Inoue et al. | |
| 6,060,166 A | * 5/2000 | Hoover et al. | |
| 6,099,974 A | * 8/2000 | Lenling | |
| 6,131,651 A | * 10/2000 | Richey, III | |
| 6,208,513 B1 | * 3/2001 | Fitch et al. | |

FOREIGN PATENT DOCUMENTS

| | | |
|---|---|---|
| EP | 805463 A1 | 11/1997 |
| JP | 62285974 | 12/1987 |
| JP | 2160891 | 6/1990 |

* cited by examiner

Primary Examiner—Deborah Jones
Assistant Examiner—Wendy Boss
(74) Attorney, Agent, or Firm—Waddey & Patterson, P.C.; James R. Cartiglia

(57) ABSTRACT

The present invention relates to a system for managing the heat from a heat source like an electronic component. More particularly, the present invention relates to a system effective for dissipating the heat generated by an electronic component using a thermal management system that includes a thermal interface formed from a flexible graphite sheet and/or a heat sink formed from a graphite article.

20 Claims, 3 Drawing Sheets

THERMAL MANAGEMENT SYSTEM

TECHNICAL FIELD

The present invention relates to a system for managing the heat from a heat source like an electronic component. More particularly, the present invention relates to a system effective for dissipating the heat generated by an electronic component.

BACKGROUND OF THE ART

With the development of more and more sophisticated electronic components, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates these negative effects.

With the increased need for heat dissipation from microelectronic devices caused by these conditions, thermal management becomes an increasingly important element of the design of electronic products. As noted, both performance reliability and life expectancy of electronic equipment are inversely related to the component temperature of the equipment.

For instance, a reduction in the operating temperature of a device such as a typical silicon semiconductor can correspond to an exponential increase in the reliability and life expectancy of the device. Therefore, to maximize the lifespan and reliability of a component, controlling the device operating temperature within the limits set by the designers is of paramount importance.

Heat sinks are components that facilitate heat dissipation from the surface of a heat source, such as a heat-generating electronic component, to a cooler environment, usually air. In many typical situations, heat transfer between the solid surface of the component and the air is the least efficient within the system, and the solid-air interface thus represents the greatest barrier for heat dissipation. A heat sink seeks to increase the heat transfer efficiency between the components and the ambient air primarily by increasing the surface area that is in direct contact with the air. This allows more heat to be dissipated and thus lowers the device operating temperature. The primary purpose of a heat sink is to help maintain the device temperature below the maximum allowable temperature specified by its designer/manufacturer.

Typically, heat sinks are formed of a metal, especially copper or aluminum, due to the ability of copper to readily absorb heat and transfer it about its entire structure. In many applications, copper heat sinks are formed with fins or other structures to increase the surface area of the heat sink, with air being forced across or through the copper fins (such as by a fan) to effect heat dissipation from the electronic component, through the copper heat sink and then to the air.

Limitations exist, however, with the use of copper heat sinks. One limitation relates to copper's relative isotropy—that is, the tendency of a copper structure to distribute heat relatively evenly about the structure. The isotropy of copper means that heat transmitted to a copper heat sink become distributed about the structure rather than being directed to the fins where most efficient transfer to the air occurs. This can reduce the efficiency of heat dissipation using a copper heat sink. In addition, the use of copper or aluminum heat sinks can present a problem because of the weight of the metal, particularly when the heating area is significantly smaller than that of the heat sink. For instance, pure copper weighs 8.96 grams per cubic centimeter (g/cc) and pure aluminum weighs 2.70 g/cc (compare with pure graphite, which weighs between about 1.4 and 1.8 g/cc). In many applications, several heat sinks need to be arrayed on, e.g., a circuit board to dissipate heat from a variety of components on the board. If copper heat sinks are employed, the sheer weight of copper on the board can increase the chances of the board cracking or of other equally undesirable effects, and increases the weight of the component itself. In addition, since copper is a metal and thus has surface irregularities and deformations common to metals, and it is likely that the surface of the electronic component to which a copper heat sink is being joined is also metal or another relatively rigid material such as aluminum oxide or a ceramic material, making a complete connection between a copper heat sink and the component, so as to maximize heat transfer from the component to the copper heat sink, can be difficult without a relatively high pressure mount, which is undesirable since damage to the electronic component could result.

What is desired, therefore, is a thermal management system effective for dissipating heat from a heat source such as an electronic component. The thermal management system should advantageously be relatively anisotropic as compared to copper, exhibit a relatively high ratio of thermal conductivity to weight, and be capable of conformable mating with the surface of the heat source.

SUMMARY OF THE INVENTION

It is an object of the present invention to provide a thermal management system for a heat source, the thermal management system being effective to increase the useful area of the surface of the heat source from which heat is to be dissipated.

Another object of the present invention is to provide a thermal management system exhibiting a relatively high degree of anisotropy.

Still another object of the present invention is to provide a thermal management system capable of forming a desirably complete thermal connection with the surface of the heat source without the need for a high pressure mount.

Yet another object of the present invention is to provide a thermal management system having a relatively high ratio of thermal conductivity to weight.

Still another object of the present invention is to provide a thermal management system that can be fabricated so as to locate the heat dissipation surfaces thereof so as to maximize the dissipation of heat from the heat source.

These objects and others that will become apparent to the artisan upon review of the following description can be accomplished by providing a heat source, such as an electronic component, the heat source having an external surface. A thermal interface mounted to the external surface of the heat source is also provided, where the thermal interface comprises an anisotropic flexible graphite sheet having a planar area greater than the area of the external surface of the heat source. In another embodiment of the invention, the thermal management system includes a heat sink which comprises a graphite article shaped so as to provide a heat collection surface and at least one heat dissipation surface, wherein arranging the heat collection surface of the graphite article in operative connection with a heat source causes dissipation of heat from the heat source through the at least one heat dissipation surface of the graphite article. The graphite article useful as the heat sink of this embodiment of the invention comprises compressed particles of exfoliated graphite, such as anisotropic flexible sheets of compressed particles of exfoliated graphite laminated into a unitary article or particles of exfoliated graphite compressed into a desired shape. In addition, the graphite article can be formed of high density graphite fabricated from finely divided carbonaceous particles.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. Graphites possess anisotropic structures and thus exhibit or possess many properties such as thermal conductivity that are highly directional. Briefly, graphites may be characterized as laminated structures of carbon, that is, structures consisting of superposed layers or laminae of carbon atoms joined together by weak van der Waals forces. In considering the graphite structure, two sets of axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers (parallel to the planar direction of the crystal structure of the graphite) or the directions perpendicular to the "c" direction.

As noted above, the bonding forces holding the parallel layers of carbon atoms together are only weak van der Waals forces. Graphites can be treated so that the spacing between the superposed carbon layers or laminae can be appreciably opened up so as to provide a marked expansion in the direction perpendicular to the layers, that is, in the "c" direction and thus form an expanded graphite structure (also referred to as exfoliated or intumesced graphite) in which the laminar character of the carbon layers is substantially retained.

Graphite flake which has been greatly expanded and more particularly expanded so as to have a final thickness or "c" direction dimension which is up to about 80 or more times the original "c" direction dimension can be formed without the use of a binder into cohesive or integrated articles and flexible graphite sheets of expanded graphite, e.g. webs, papers, strips, tapes, or the like. The formation of graphite particles which have been expanded to have a final thickness or "c" dimension which is up to about 80 or more times the original "c" direction dimension into integrated articles and flexible sheets by compression, without the use of any binding material, is believed to be possible due to the excellent mechanical interlocking, or cohesion, which is achieved between the voluminously expanded graphite particles.

In addition to flexibility, the graphite material, as noted above, has also been found to possess a high degree of anisotropy with respect to thermal conductivity, comparable to the graphite starting material due to orientation of the expanded graphite particles substantially parallel to the opposed faces of the sheet resulting from high compression, e.g. roll pressing. Sheet material thus produced has excellent flexibility, good strength and a very high degree of orientation.

Generally, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is up to about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.05 grams per cubic centimeter to about 1.8 grams per cubic centimeter. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increased density. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprising the "a" directions and the thermal properties of the sheet are very different, by more than an order of magnitude, for the "c" and "a" directions (i.e., about 7 watts per meter-° C. (w/m° C.) vs. about 150–200 w/m° C).

With respect to thermal properties, the thermal conductivity of a flexible graphite sheet in a direction parallel to the upper and lower surfaces of the flexible graphite sheet is relatively high, while it is relatively very low in the "c" direction transverse to the upper and lower surfaces, by a ratio that can approach 20 to one or higher.

Similarly, a compressed expanded graphite article can be produced by compressing or compacting under a predetermined load (and again without the necessity of a binder), expanded graphite particles. The particles can be compressed into a mold under pressures of at least about 100 pounds per square inch (psi), and will retain their final shape and exhibit significant and measurable anisotropy.

BRIEF DESCRIPTION OF THE DRAWINGS

The present invention will be better understood and its advantages more apparent in view of the following detailed description, especially when read with reference to the appended drawings, wherein.

DETAILED DESCRIPTION OF THE PREFERRED EMBODIMENT

Figure 1:
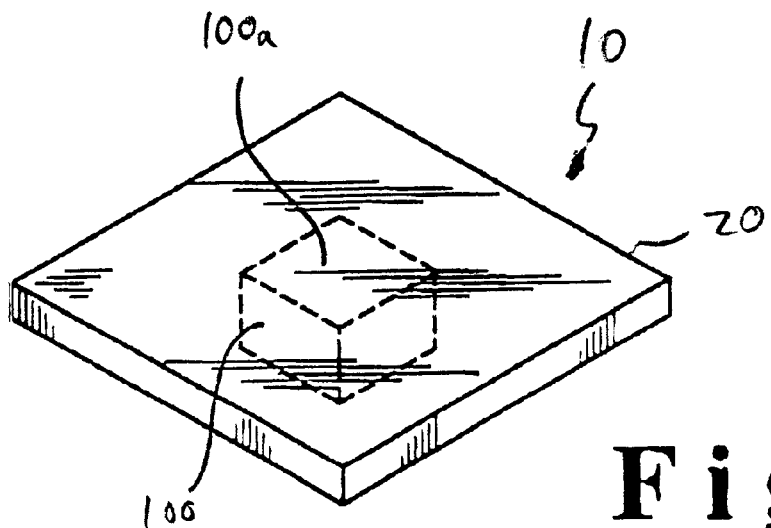
FIG. 1 is a top perspective view of one embodiment of a thermal management system in accordance with the present invention, showing a heat source in phantom.

Referring to the drawings in detail, a thermal management system prepared in accordance with the present invention is shown and generally designated by the reference numeral 10. It should be noted that for the sake of clarity not all the components and elements of system 10 may be shown and/or marked in all the drawings. Also, as used in this description, the terms "up," "down," "top," "bottom," etc. refer to thermal management system 10 when in the orientation shown in FIGS. 3, 4 and 6. However, the skilled artisan will understand that thermal management system 10 can adopt any particular orientation when in use.

Thermal management system 10 is intended to be used to facilitate the dissipation of heat from a heat source, more particularly from an electronic component 100. Electronic component 100 can comprise any electronic device or component that produces sufficient heat to interfere with the operation of electronic component 100 or the system of which electronic component 100 is an element, if not dissipated. Electronic component 100 can comprise a microprocessor or computer chip, an integrated circuit, control electronics for an optical device like a laser or a field-effect transistor (FET), or components thereof, or other like electronic element. Electronic component 100 includes at least one surface 100a (denoted an "external surface") from which heat radiates and which can be used as a source of heat to be dissipated from electronic component 100.

Figure 2:
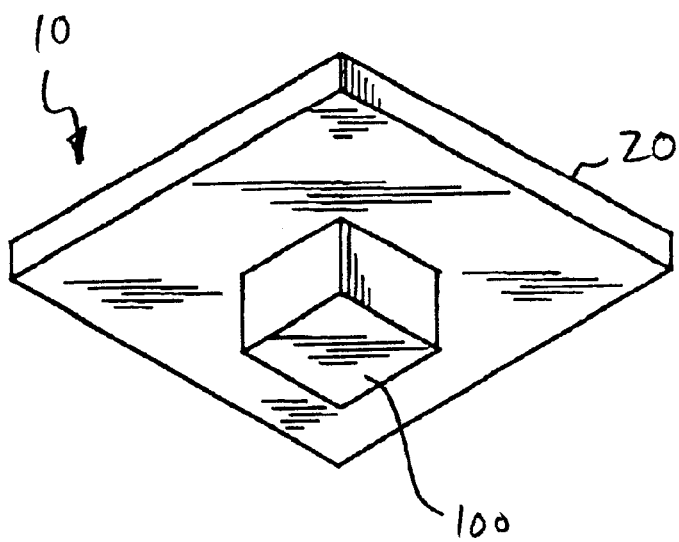
FIG. 2 is a bottom perspective view of the thermal management system of FIG. 1.
Figure 3:
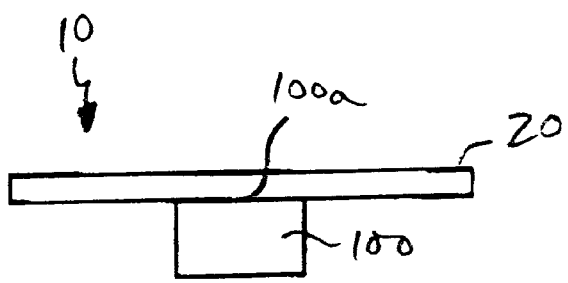
FIG. 3 is a side plan view of the thermal management system of FIG. 1.

Referring now to FIGS. 1, 2 and 3, in one embodiment thermal management system 10 includes a thermal interface 20. A principal function of thermal interface 20 is to form a sufficient operative connection with external surface 100a of electronic component 100 without the need for the exertion of undesirably high amounts of pressure. Depending on the nature of the other constituents of thermal management system 10, a second function of thermal interface 20 can be to increase the effective surface area of surface 100a of electronic component 100, to facilitate heat dissipation from electronic component 100.

To that end, thermal interface 20 preferably comprises an anisotropic flexible graphite sheet. By an anisotropic flexible graphite sheet is meant a sheet of compressed, exfoliated graphite, especially natural graphite. As discussed above, graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are referred to as "particles of intercalated graphite." Upon exposure to high temperature, the particles of intercalated graphite expand in dimension as much as 80 or more times their original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets which, unlike the original graphite flakes, can be formed and cut into various shapes.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 50 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid.

In a preferred embodiment, the intercalating agent is a solution of a mixture of sulfuric acid, or sulfuric acid and phosphoric acid, and an oxidizing agent such as nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

After the flakes are intercalated, any excess solution is drained from the flakes and the flakes are water-washed. The quantity of acid solution (intercalant) retained inside the flakes after draining and washing may range from 5 to 150 parts of solution by weight per 100 parts by weight of graphite flakes (pph) and more typically about 10 to 110 pph. Alternatively, the quantity of the intercalant may be limited to between 10 to 50 parts of solution per hundred parts of graphite by weight which permits the washing step to be eliminated as taught and described in U.S. Pat. No. 4,895,713, the disclosure of which is also herein incorporated by reference. Upon exposure to high temperature, e.g. temperatures of 300° C., and especially 700° C. to 1000° C. and higher, the particles of intercalated graphite expand as much as 80 to 1000 or more times their original volume in an accordion-like fashion in the c-direction (in the direction perpendicular to the crystalline planes of the constituent graphite particles) to form expanded graphite particles or worms. The resulting worms may be compressed together into flexible sheets.

Flexible graphite sheet is coherent, with good handling strength, and is suitably compressed, such as by roll-pressing, to a thickness of 0.0075 to 0.38 centimeters and a density of 0.05 to 1.8 grams per cubic centimeter. From about 1.5–50% by weight of ceramic additives can be blended with the intercalated graphite flakes as described in U.S. Pat. No. 5,902,762 (which is incorporated herein by reference) to provide enhanced resin impregnation (for increased strength) in the final flexible graphite product. The additives include ceramic fiber particles having a length of 0.15 to 1.5 millimeters. The width of the particles is suitably from 0.04 to 0.004 mm. The ceramic fiber particles are non-reactive and non-adhering to graphite and are stable at temperatures up to 1000° C., preferably 1300° C., or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

Once the flexible graphite sheet is prepared as described, it can then be cut to size to form thermal interface 20. Depending on the application, a series of flexible graphite sheets of the desired dimensions can be laminated together to form a sandwich using a pressure sensitive adhesive, such as an acrylic adhesive, to form thermal interface 20, but it will be recognized that the more layers that are applied (with intervening adhesive), desirable thermal properties will be degraded. Preferably, therefore, thermal interface 20 comprises a single flexible graphite sheet.

An advantage of the use of thermal interface 20 is in its conformability. Since external surface 100*a* of electronic component 100 is generally formed of a metallic material, or other like material, the surface of external surface 100*a* is not perfectly smooth (even though it may appear so to the naked eye, or to the touch), but is rather covered by surface deformations and irregularities, or "peaks and valleys." Because of these deformations, achieving a firm thermal connection with a metallic (such as copper) or other type of heat sink which also has surface deformations is difficult without exerting a great deal of pressure to make the thermal connection. Indeed, pressures well in excess of 50 pounds per square inch (psi) are often needed for such metal to metal connections. Such pressures have the potential to damage electronic component 100. Since thermal interface 20 is conformable to the surface topography of external surface 100*a* of electronic component 100 as well as to a metallic heat sink, a good thermal connection between electronic component 100 and a heat sink having surface deformations can be achieved without application of potentially damaging pressure. Pressures less than 50 psi are usually all that are needed; in fact pressures as low as 15 psi and even lower are often sufficient to create an effective thermal connection between electronic component 100, thermal interface 20 and a heat sink. Of course, the need for thermal interface 20 to achieve good thermal connection is reduced if the heat sink is formed of a conformable material like graphite, as discussed hereinbelow.

Thermal interface 20 can also function to broaden the effective area of external surface 100*a* of electronic component 100. As noted, the flexible graphite sheet out of which thermal interface 20 is constructed is anisotropic; that is, the thermal conductivity of thermal interface 20 is significantly greater in the "a" direction (the direction parallel to the crystalline planes of the graphite, or along the surface of the flexible graphite sheet) than in the "c" direction (the direction perpendicular to the crystalline planes of the graphite, or transverse to the flexible graphite sheet), often by a factor of 20 times or greater. Thus, when thermal interface 20 is arrayed or mounted on external surface 100*a* of electronic component 100 such that one of its planar surfaces 20*a* sits against external surface 100*a*, as shown in FIGS. 1 and 2, heat generated by or from electronic component 100 spreads about the planar surfaces 20*a* and 20*b* of thermal interface 20, not just directly through thermal interface 20 in the "c" direction. When thermal interface 20 has a surface area greater than that of external surface 100*a* of electronic component 100, therefore, heat from electronic component 100 spreads about the surface area of thermal interface 20, thus providing a greater surface area from which the heat can be dissipated. In this manner, for instance, a larger surface area of a heat sink can be used, resulting in improved heat dissipation properties as compared with conventional thermal interface materials such as silicone materials, polyesters, acrylics and thermally conductive greases, which tend to "channel" heat rather than spread it. Desirably, the surface area of thermal interface 20 is at least twice, and more preferably at least four times the surface area of external surface 100*a* of electronic component 100, depending on the thickness of thermal interface 20 and the heat flux of electronic component 100.

Thermal interface 20 can be adhered or mounted to external surface 100*a* of electronic component 100 by several methods. For instance, a thin layer of a pressure sensitive thermally activated adhesive can be used to mount thermal interface 20 to electronic component 100. Alternatively, when a heat sink is being employed, thermal interface 20 can be "sandwiched" between the heat sink and electronic component 100. The skilled artisan will recognize other, equally effective, ways to adhere or mount thermal interface 20 to electronic component 100.

Referring now to FIGS. 4–7, thermal management system 10 of the present invention preferably also comprises a heat sink 30 that comprises a graphite article shaped so as to provide a heat collection surface 30*a* and at least one heat dissipation surface 32. When heat collection surface 30*a* of heat sink 30 is in operative connection with a heat source, i.e., external surface 100*a* of electronic component 100, heat is dissipated from external surface 100*a* through the at least one heat dissipation surface 32 of heat sink 30.

Heat dissipation surface as used herein refers to an area of heat sink 30 from which the heat transmitted to heat sink 30 from external surface 100*a* (through thermal interface 20 when present) is dissipated into the environment. Most commonly, the at least one heat dissipation surface 32 of heat sink 30 are those surfaces of heat sink 30 where air or another coolant fluid is passed across heat sink 30 such as by the action of a fan (not shown). To maximize heat transfer from heat sink 30 to the coolant fluid, the at least one heat dissipation surface 32 of heat sink 30 should be designed and/or shaped so as to have as great a surface area as feasible.

Figure 4:
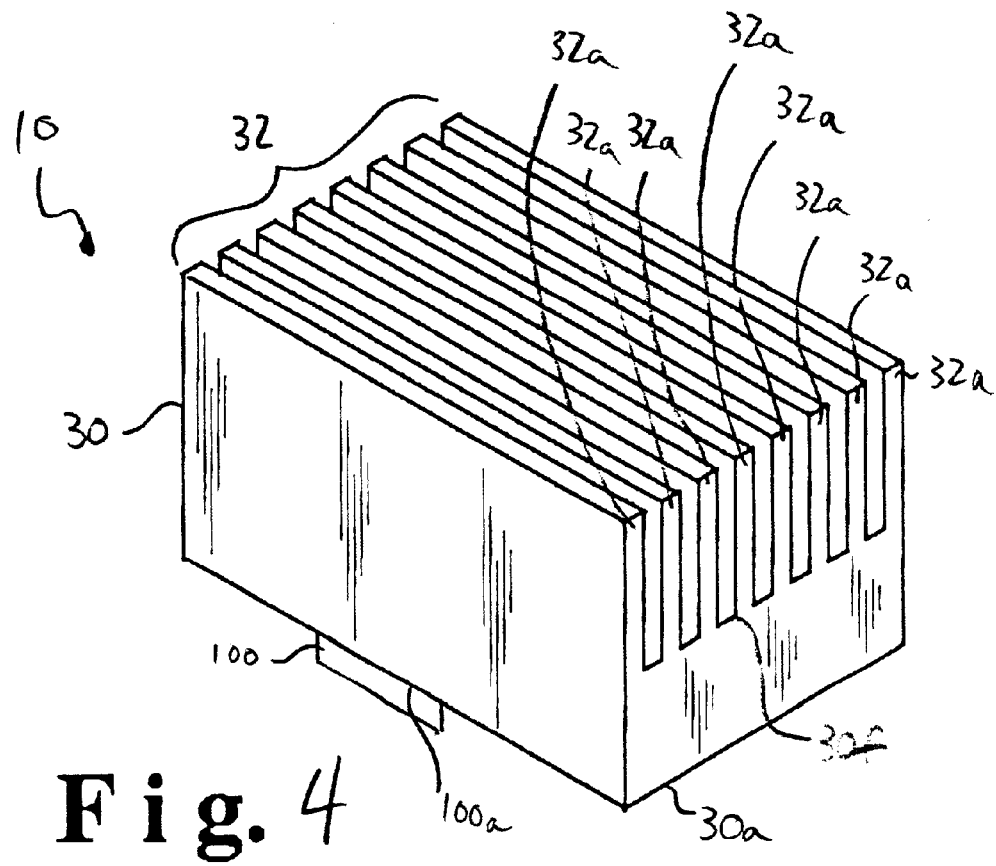
FIG. 4 is a top perspective view of another embodiment of a thermal management system in accordance with the present invention.
Figure 5:
FIG. 5 is a top plan view of the thermal management system of FIG. 4.

For instance, and as illustrated in FIGS. 4 and 5, the at least one heat dissipation surface 32 of heat sink 30 comprises fins 32*a* formed at a surface of heat sink 30 opposite heat collection surface 30*a*, such that heat travels from heat collection surface 30*a* to fins 32*a*, where air or other coolant passing across fins 32*a* can absorb the heat from fins 32*a* and thereby carry it away (and, by extension, away from electronic component 100). The number and size and shape of fins 32*a* can be chosen by the practitioner to achieve a balance between coolant flow and surface area. For instance, more fins 32*a*, each of which is thinner with less space therebetween, will provide increased surface area, but may interfere with coolant flow; likewise, fewer, larger fins 32*a*, with greater space therebetween will result in greater thermal convection efficiency but less surface area. In a preferred embodiment, where heat sink 30 is shaped as a block (in other words, a cube) whose walls are each about 0.1 inches long (and generally no more than about 2.0 inches long, although this will vary depending on the size of electronic component 100), as shown in FIGS. 4 and 5, a "top" wall 30*f* will have a plurality, and most commonly about 2 to 15, fins 32*a* extending therefrom, each fin 32*a* being about 0.5 to 1.5 inches in height ("h") and about 0.01 to 0.35 inches in thickness ("t"), with the distance therebetween depending on the dimensions of heat sink 30 and the number and size of fins 32*a*. Of course, as noted above, the particular dimensions of heat sink 30 and fins 32*a* will vary depending on the particular application and desires of the practitioner.

Figure 6:
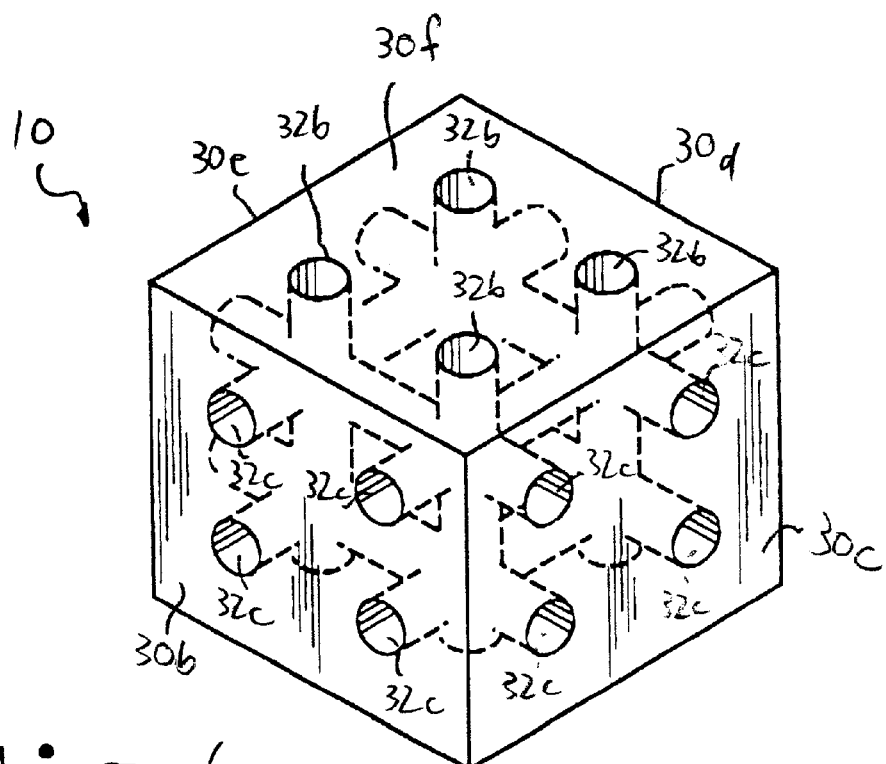
FIG. 6 is a side perspective view of yet another embodiment of a thermal management system in accordance with the present invention.
Figure 7:
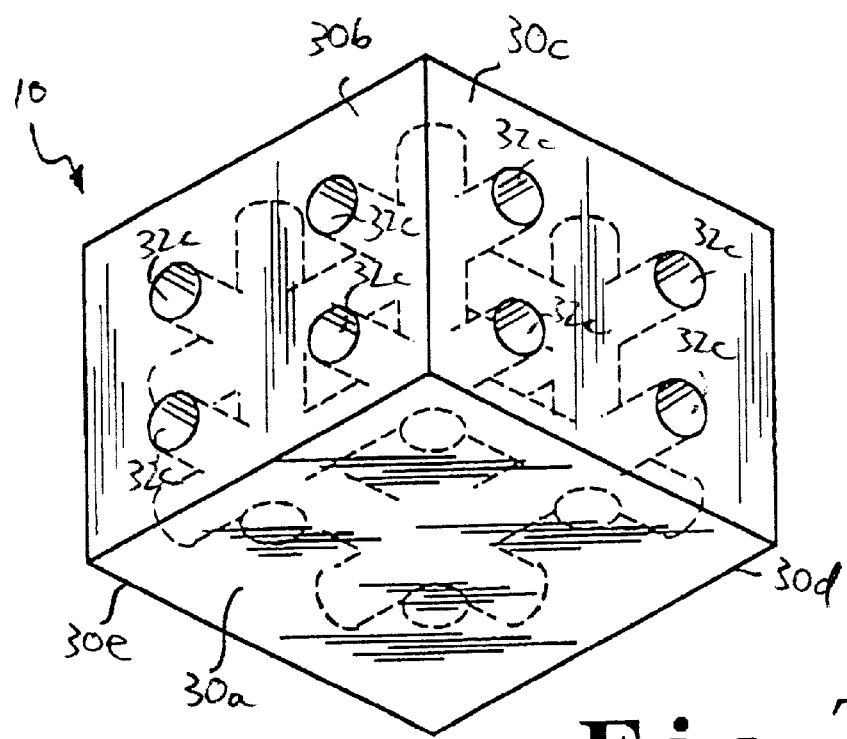
FIG. 7 is a bottom perspective view of the thermal management system of FIG. 6.

In another embodiment, illustrated in FIGS. 6 and 7, heat sink 30 has structural features comprising cavities 32b, conduits therethrough 32c or combinations of cavities 32b and conduits therethrough 32c, where the at least one heat dissipation surface 32 of heat sink 30 comprises surfaces of the cavities 32b and/or conduits 32c. Cavities 32b are useful for increasing the surface area of heat sink 30, by extending down through the top 30f of heat sink 30 (in the orientation shown in FIG. 6) towards but not through heat collection surface 30a (clearly, if cavities 32b extend through heat collection surface 30a, the effectiveness of heat sink 30 may be reduced since the area of operative connection between external surface 100a of electronic component 100 and heat collection surface 30a of heat sink 30 would be reduced). Cavities 32b can be of any particular size and shape as desired by the artisan, to produce the desired amount of heat dissipation. The walls (i.e., surfaces) of cavities 32b function as some of the at least one heat dissipation surface 32 of heat sink 30.

Likewise, conduits 32c run through heat sink 30 so as to not reduce the surface area of heat collection surface 30a. Conduits 32c can assume any particular shape or size, provided they permit coolant flow therethrough. Preferably, conduits 32c interact and intersect with cavities 32b and with each other so as to permit and maximize coolant flow through cavities 32b also. Again, the surfaces of conduits 32c function as some of the at least one heat dissipation surfaces 32 of heat sink 30. The number and size and shape of cavities 32b and conduits 32c can be chosen by the practitioner to achieve a balance between coolant flow and surface area. For instance, smaller (in diameter), but more in number, cavities 32b and conduits 32c will result in greater surface area but reduced coolant flow (because of the fluid dynamics involved in achieving fluid flow through a small diameter opening); larger, but fewer in number, cavities 32b and conduits 32c will lead to reduced surface area but greater coolant flow.

In a preferred embodiment, where heat sink 30 is shaped as a block (in other words, a cube) whose walls are each about 0.1 inches long (and in many cases, not more than about 2.0 inches long), as shown in FIGS. 6 and 7, "side" walls 30b, 30c, 30d and 30e will each have at least one and preferably about 3 to 6 conduits 32c extending therethrough (clearly, opposing side walls will "share" conduits 32c, with one conduit opening appearing in one side wall, such as 30b, and the corresponding other conduit opening appearing in the opposite side wall, such as 30d). Likewise, "top" wall 30f of heat sink 30 will have at least one and preferably about 3 to 6 cavities 32b extending therein, and through heat sink 30, but not opening into heat collection surface 30a opposite top wall 32f, as discussed above. Cavities 32b and conduits 32c should each have a diameter of about 0.03 to about 0.5 inches or larger (depending on the dimensions of heat sink 30). Of course, as noted above, the particular dimensions of heat sink 30 and cavities 32b and conduits 32c will vary depending on the particular application and desires of the practitioner.

As noted above, heat sink 30 comprises a graphite article. Advantageously, heat sink 30 is formed from compressed particles of exfoliated graphite. As discussed with respect to thermal interface 20, in preparing flexible graphite sheet, particles of intercalated graphite are expanded to form particles of exfoliated graphite, which are then compressed into sheet. Rather than form the particles of exfoliated graphite into sheet, the particles can be compressed into blocks or other shapes suitable for use as heat sink 30. Blocks formed from particles of exfoliated graphite can be compressed into the desired shapes, with fins 32a, etc. Alternatively, heat sink 30 formed from particles of exfoliated graphite compressed into a block or other shape and then machined and/or otherwise treated (such as punched) so as to have fins 32a, cavities 32b and/or conduits 32c, as desired.

In a particularly advantageous embodiment, heat sink 30 can be formed from anisotropic flexible sheets of compressed particles of exfoliated graphite (prepared as discussed above) laminated into a unitary article, such as a block or other desirable shape. The anisotropic flexible sheets of compressed particles of exfoliated graphite can be laminated with a suitable adhesive, such as pressure sensitive or thermally activated adhesive, therebetween. The adhesive chosen should balance bonding strength with minimizing thickness, and be capable of maintaining adequate bonding at the service temperature of electronic component 100. Suitable adhesives would be known to the skilled artisan. Most preferably, the "a" direction extending parallel to the planar direction of the crystal structure of the graphite of the anisotropic flexible sheets of compressed particles of exfoliated graphite which form this embodiment of heat sink 30 extends between heat collection surface 30a and the at least one heat dissipation surface 32 of heat sink 30. In this way, the anisotropic nature of the graphite sheet directs the heat from external surface 100a of electronic component 100 towards the at least one heat dissipation surface 32 (i.e., in the "a" direction along the graphite sheet), and is not depended by the presence of the adhesive.

In another embodiment of thermal management system 10, heat sink 30 is fabricated from high density graphite formed from finely divided carbonaceous particles, especially carbonaceous particles have a particle size of less than 100 mesh. Such high density graphite bodies can be fabricated by a carbonaceous filler in the form of a fiber or particulate, for example, a finely divided petroleum coke, graphite flour, raw coke, carbon black, activated carbon, glassy carbon or the like is ground to a fine particle size and then mixed with a pitch binder. For preparing dense carbon articles having excellent internal structure and porosity, the filler should preferably have a particle size of less than about 100 mesh (0.149 mm). A preferred filler is graphite flour with a particle size less than 200 mesh (0.074 mm).

The pitch binder should have a coking value of at least about 70 percent or greater. By the term "coking value" is meant the percentage of coke that is present in the residue from a given sample of carbonaceous material after the sample has been heated to a predetermined baking temperature at a given rate of temperature rise, according to the procedure of ASTM-D2146. A suitable pitch binder is a milled pitch having a high coking value of at least about 70 percent and a higher softening point above about 300° C. A preferred pitch binder for use in the mixture is a mesophase pitch having a coking value in the range of between about 75 and about 90 percent and a softening point of about 330° C.

The ratio of carbonaceous filler to pitch binder in the mixture to form the shaped body may vary within a range of from about 4:1 to about 0.5:1. A suitable mixture for use in forming the shaped bodies may comprise, for example, from about 70 to about 85 weight percent carbonaceous filler, e.g. petroleum coke or graphite flour, and from about 15 to 30 weight percent binder, e.g. mesophase pitch.

The carbonaceous filler and binder are thoroughly blended for a sufficiently long period of time to assure a uniform mixing of all the components. After mixing, the mixture is formed into a shaped body preferably by molding.

During the molding of the shaped body, the mixture of carbonaceous filler and pitch may be compressed under a pressure of up to about 200 psi while heated to elevated temperatures up to the softening point of the pitch binder as a maximum, e.g. about 330° C. in the case of mesophase pitch. Alternatively, the mixture may be cold pressed at a higher pressure, for example, between about 400 psi and about 800 psi at room temperature.

The shaped body is then embedded in finely divided, non-reactive particles made of any material which will not react or decompose when heated to elevated baking temperatures of about 750° C. or more. Suitable materials for the non-reactive particles are graphite, coke and boron nitride, for example. The particles should be made of a material that is highly refractory and able to withstand the effects of graphitizing temperatures. Graphite powders are preferably used as the non-reactive particles in this instance.

Generally speaking, the particular size of the non-reactive particles is not narrowly critical. However, the particles should not be so small as to preclude the escape or egress of volatile gases through the porous envelope during the baking operation. It has been found that graphite powders having an average particle size of about 10 mesh (1.68 mm) are ideal for use in the practice of the present invention. However, graphite powders having a particle size as small as 400 mesh (0.037 mm) may also be employed without adversely affecting gas venting through the porous envelope.

The shaped body is surrounded by the non-reactive particles so as to completely embed the shaped body within the envelope. The particles are packed around the body in a relatively thick layer, e.g. about 2–4 inches in the case of a shaped body having an average diameter of about 20 inches. The shaped body embedded in the non-reactive particles is then compressed while being heated to a baking temperature, a temperature sufficient to carbonize the pitch binder in the shaped body. Preferably, the shaped article is heated slowly at a predetermined rate of temperature rise up to a suitable baking temperature, e.g. about 750° C. The particular rate of temperature rise used to heat the shaped body will vary depending upon the size of the article being fabricated. For example, a 20 inch diameter by 15 inch long cylindrical billet may be heated to a baking or curing temperature without cracking or other adverse effect at a rate of about 50° C. per hour. It will of course be evident that larger size billets will require a slower rate of temperature rise while, on the other hand, smaller billets may be heated at an even faster or more rapid rate. The shaped body is preferably heated inductively. Other means for heating the shaped body in the die while surrounded by the envelope can of course be employed.

After the shaped body has reached a temperature that is approximately equivalent to the softening temperature of the pitch binder, a pressure is applied to the envelope of non-reactive particles. This may be accomplished by applying a load to an end plunger of the mold containing the envelope of non-reactive particles. The pressure is transferred via the non-reactive particles, and applied isostatically around the entire surface of the shaped body, which compresses and further densifies the body. The temperature of the shaped body is gradually raised to the maximum baking temperature during the entire compression. Moreover, the pressure that is applied isostatically around the shaped body should be kept at a relatively low pressure, e.g. about 200 psi, and preferably no higher than about 400 psi. This is particularly important in the case where the shaped body is to be subsequently graphitized after baking. Suitable pressures for use in compressing the shaped body while heating, according to the present invention, will generally range from about 200 to 350 psi.

Graphitization of the compressed and heated carbon body can take place while the body still remains inside the die. In such case, suitable means must be provided in association with the die for heating the body to elevated graphitizing temperatures, e.g. at least about 2800° C. However, it may be preferable to remove the baked body from the die after cooling and then transfer the cooled body to a separate graphitizing furnace.

High density graphite heat sink 30 can be fabricated to size, or in larger billets which can then be sawed and machined, or otherwise cut to size. The high density graphite heat sink 30 can be formed in specific shapes, such as having fins 32a fabricated therein. Alternatively, high density graphite heat sink 30 can be fabricated as a block or other basic shape, with fins 32a, cavities 32b, conduits 32c, or other structures useful as the at least one heat dissipation surface 32 machined thereinto by methods known to the skilled artisan.

Heat sink 30 can be mounted to electronic component 100 by conventional means, such as by mounting directly to electronic component 100 using an adhesive, such as a pressure sensitive or thermally activated adhesive (something which the relatively low weight of graphite permits); mounting to thermal interface 20, if present, such as by an adhesive; or mounting to the board or other object on which electronic circuit 100 is mounted, provided heat collection surface 30a of heat sink 30 is operatively connected to external surface 100a of electronic component 100 (directly or through thermal interface 20).

The use of graphite to form heat sink 30 has many significant advantages. As discussed, the anisotropic nature of graphite allows the practitioner to direct the heat from external surface 100a of electronic component 100 to the at least one heat dissipation surface 32. Graphite materials have the further advantage of relatively low density, and thus relatively low weight. For instance, articles formed from exfoliated graphite particles generally have a density below about 1.3 grams/cubic centimeter (g/cc). High density graphite articles have a density below about 1.9 g/cc. When compared with the density of copper—approximately 8.9 g/cc for pure copper—a graphite article of the same approximate size and volume of a copper article will weight significantly less.

The weight advantage of graphite over copper or other metals can be expressed in terms of their respective thermal conductivity. If one considers thermal conductivity per unit weight (sometimes referred to in the art as specific thermal conductivity, although the term may be a misnomer), exfoliated graphite heat sinks have a specific thermal conductivity of about 0.134 watts-meter$^2$ per kilogram-° C. (wm$^2$/kg° C.) to about 0.184 wm$^2$/kg° C. and high density graphite heat sinks have a specific thermal conductivity of about 0.05 to about 0.075 wm$^2$/kg° C., whereas copper heat sinks have a specific thermal conductivity of about 0.019 to about 0.051 wm$^2$/kg° C. (for a specific thermal conductivity of 0.051, the heat sink would have to be formed of pure copper). Thus, per unit weight, graphite heat sinks can be far more effective at heat dissipation from electronic component 100, without the disadvantages of "loading" a circuit board or other component with excess weight. When the further advantages provided by the anisotropic nature of graphite are considered, heat sinks 30 of the present invention are distinctly advantageous.

The following example is presented to further illustrate and explain the present invention and should not be viewed as limiting in any regard.

EXAMPLE

A test apparatus was prepared, consisting of a heat source having an upper surface consisting of a generally flat surface of ½"×¼" in size, arrayed in a wind tunnel. Various embodiments of thermal management systems were installed on the heat source, with temperature measurements taken at Location A, adjacent the heat source/thermal management system interface and at Location B, on the thermal management system at a position farthest from the heat source (the lower the temperature reading at Locations A and B, the better the heat dissipation characteristics of the thermal management system being tested).

Run 1—a thermal management system consisting of a copper heat sink having dimensions of 1"×1"×0.8" and having 8 straight fins was arrayed on the heat source. A thermal interface consisting of a 1"×1" sheet of anisotropic flexible graphite sheet was interposed between the copper heat sink and the heat source. The testing wind speed was 1.6 meters per second (m/s).

Run 2—a thermal management system consisting of a copper heat sink having dimensions of 1"×1"×0.8" and having 8 straight fins was arrayed on the heat source. A thermal interface consisting of a 1"×1" sheet of anisotropic flexible graphite sheet was interposed between the copper heat sink and the heat source, with a thin adhesive layer between the thermal interface and the heat sink. The testing wind speed was 1.6 meters per second (m/s).

Run 3—as a control, a thermal management system consisting of a copper heat sink having dimensions of 1"×1"×0.8" and having 8 straight fins was arrayed on the heat source. No thermal interface was interposed between the copper heat sink and the heat source. The testing wind speed was 1.6 meters per second (m/s).

The results are shown in Table I

TABLE I

| Run # | Temp. at Location A (° C.) | Temp. at Location B (° C.) |
| --- | --- | --- |
| 1 | 32.4 | 32.0 |
| 2 | 31.3 | 29.9 |
| 3 | 32.6 | 32.1 |

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A thermal management system comprising a heat source having an external surface and a thermal interface which comprises an anisotropic flexible graphite sheet formed by compressing exfoliated particles of natural graphite and having a planar area greater than the area of the external surface of the heat source, the flexible graphite sheet having first and second major planar surfaces and having axes of higher thermal conductivity parallel to said major planar surfaces, one of said major planar surfaces being in direct operative contact with the heat source.

2. The thermal management system of claim 1 wherein the heat source comprises an electronic component.

3. A thermal management system comprising a heat sink which comprises a graphite article shaped so as to provide a heat collection surface and at least one heat dissipation surface, and said system further comprising a thermal interface operatively connected to the heat sink, the thermal interface comprising an anisotropic flexible graphite sheet having two parallel planar surfaces extending in a direction parallel to the planar direction of the crystal structure of the graphite in the sheet, wherein arranging the heat collection surface of the graphite article in direct operative contact with one of said planar surfaces and arranging the other of said planar surfaces in direct operative contact with a heat source causes dissipation of heat from the heat source through the at least one heat dissipation surface of the graphite article.

4. The thermal management system of claim 3 wherein the at least one heat dissipation surface of the graphite article comprises fins formed at a surface of the graphite article opposite the heat collection surface.

5. The thermal management system of claim 3 wherein the graphite article has structural features comprising cavities therein, holes therethrough or combinations of cavities therein and holes therethrough, the at least one heat dissipation surface of the graphite article comprising surfaces of the structural features.

6. The thermal management system of claim 3 herein the graphite article comprises compressed particles of exfoliated graphite.

7. The thermal management system of claim 6 wherein the graphite article comprises anisotropic flexible sheets of compressed particles of exfoliated graphite laminated into a unitary article.

8. The thermal management system of claim 7 wherein the anisotropic flexible sheets of compressed particles of exfoliated graphite are laminated with a pressure sensitive or thermally activated adhesive therebetween.

9. The thermal management system of claim 7 wherein the anisotropic flexible sheets of compressed particles of exfoliated graphite have an "a" direction extending parallel to the planar direction of the crystal structure of the graphite, and further wherein the unitary article is formed such that the "a" direction of the anisotropic flexible sheets of compressed particles of exfoliated graphite extends between the heat collection surface and the at least one heat dissipation surface of the graphite article.

10. The thermal management system of claim 3 wherein the graphite article comprises high density graphite formed from finely divided carbonaceous particles.

11. The thermal management system of claim 10 wherein the carbonaceous particles have a particle size of less than about 100 mesh.

12. The thermal management system of claim 3 which further comprises a heat source comprising an electronic component having an external surface, wherein one of the planar surfaces of the thermal interface is in direct operative contact with the external surface of the heat source and the second of the planar surfaces of the thermal interface is in direct operative contact with the heat collection surface of the heat sink.

13. A thermal management system comprising:
   (a) a heat source which comprises an electronic component, the heat source having an external surface;
   (b) a thermal interface comprising an anisotropic flexible graphite sheet having two parallel planar surfaces extending in a direction parallel to the planar direction of the crystal structure of the graphite in the sheet, a first of the planar surfaces of the thermal interface being in operative contact with the external surface of the heat source, wherein the planar area of the first planar surface of the thermal interface is greater than the area of the external surface of the heat source; and (c) a heat sink which comprises a graphite article shaped so as to provide a heat collection surface and at least one heat dissipation surface, the heat collection surface of the heat sink being in operative contact with the second of the planar surfaces of the thermal interface.

14. The thermal management system of claim 13 wherein the at least one heat dissipation surface of the heat sink comprises fins formed at a surface of the graphite article opposite the heat collection surface.

15. The thermal management system of claim 13 wherein the graphite article has structural features comprising cavities therein, holes therethrough or combinations of cavities therein and holes therethrough, the at least one heat dissipation surface of the heat sink comprising surfaces of the structural features of the graphite article.

16. The thermal management system of claim 13 wherein the graphite article comprises compressed particles of exfoliated graphite.

17. The thermal management system of claim 16 wherein the graphite article comprises anisotropic flexible sheets of compressed particles of exfoliated graphite laminated into a unitary article.

18. The thermal management system of claim 17 wherein the anisotropic flexible sheets of compressed particles of exfoliated graphite have an "a" direction extending parallel to the planar direction of the crystal structure of the graphite, and further wherein the unitary article is formed such that the "a" direction of the anisotropic flexible sheets of compressed particles of exfoliated graphite extends between the heat collection surface and the at least one heat dissipation surface of the graphite article.

19. The thermal management system of claim 13 wherein the graphite article comprises high density graphite formed from finely divided carbonaceous particles.

20. The thermal management system of claim 19 wherein the carbonaceous particles have a particle size of less than 100 mesh.

\* \* \* \* \*

UNITED STATES PATENT AND TRADEMARK OFFICE
CERTIFICATE OF CORRECTION

PATENT NO.   : 6,482,520 B1
DATED        : November 19, 2002
INVENTOR(S)  : Jing Wen Tzeng It is certified that error appears in the above-identified patent and that said Letters Patent is hereby corrected as shown below:

Column 14,
Line 25, "...claim 3 herein the" should read as -- ...claim 3 wherein the --

Signed and Sealed this

Fourth Day of March, 2003

JAMES E. ROGAN
*Director of the United States Patent and Trademark Office*

US006482520C1

(12) EX PARTE REEXAMINATION CERTIFICATE (6009th)
United States Patent
Tzeng

(10) Number: US 6,482,520 C1
(45) Certificate Issued: Nov. 13, 2007

(54) THERMAL MANAGEMENT SYSTEM

(75) Inventor: Jing Wen Tzeng, Brunswick, OH (US)

(73) Assignee: JPMorgan Chase Bank, New York, NY (US)

Reexamination Request:
No. 90/007,637, Jul. 20, 2005

Reexamination Certificate for:
Patent No.: 6,482,520
Issued: Nov. 19, 2002
Appl. No.: 09/513,001
Filed: Feb. 25, 2000

Certificate of Correction issued Mar. 4, 2003.

(51) Int. Cl.
*H01L 21/48* (2006.01)
*H01L 21/02* (2006.01)
*H01L 23/34* (2006.01)
*H01L 23/373* (2006.01)

(52) U.S. Cl. ............ 428/408; 428/131; 361/709; 165/905; 165/907; 257/712; 257/722; 257/E23.11; 257/E23.112; 423/414; 423/455 R; 423/448

(58) Field of Classification Search .................. None
See application file for complete search history.

(56) References Cited

U.S. PATENT DOCUMENTS 5,523,260 A * 6/1996 Missele .................. 156/330

5,780,820 A * 7/1998 Komyoji et al. ............ 219/543

FOREIGN PATENT DOCUMENTS

JP 10-56114 2/1998
JP 11-179830 7/1999

OTHER PUBLICATIONS

Toyo Tanso Co., Ltd., accessed at <http://www.toyotan-so.co.jp/index_en.php>, on Jan. 18, 2006, 2 pages.

Toyo Tanso Co., Ltd., "Compound materials and other products [Graphite sheets(PERMA–FOIL)]", accessed at <http://www.toyotanso.co.jp/Products_CompoundMaterials_GraphiteSheets_en.html<,, on Jan. 18, 2006, 3 pages.

Toyo Tanso Co., Ltd., "Characteristics of PERMA–FOIL", accessed at <http://www.toyotanso.co.jp/Products_CompoundMaterials_GraphiteSheets_detail_en.html>, on Jan. 18, 2006, 2 pages.

* cited by examiner

Primary Examiner—Stephen Stein

(57) ABSTRACT

The present invention relates to a system for managing the heat from a heat source like an electronic component. More particularly, the present invention relates to a system effective for dissipating the heat generated by an electronic component using a thermal management system that includes a thermal interface formed from a flexible graphite sheet and/or a heat sink formed from a graphite article.

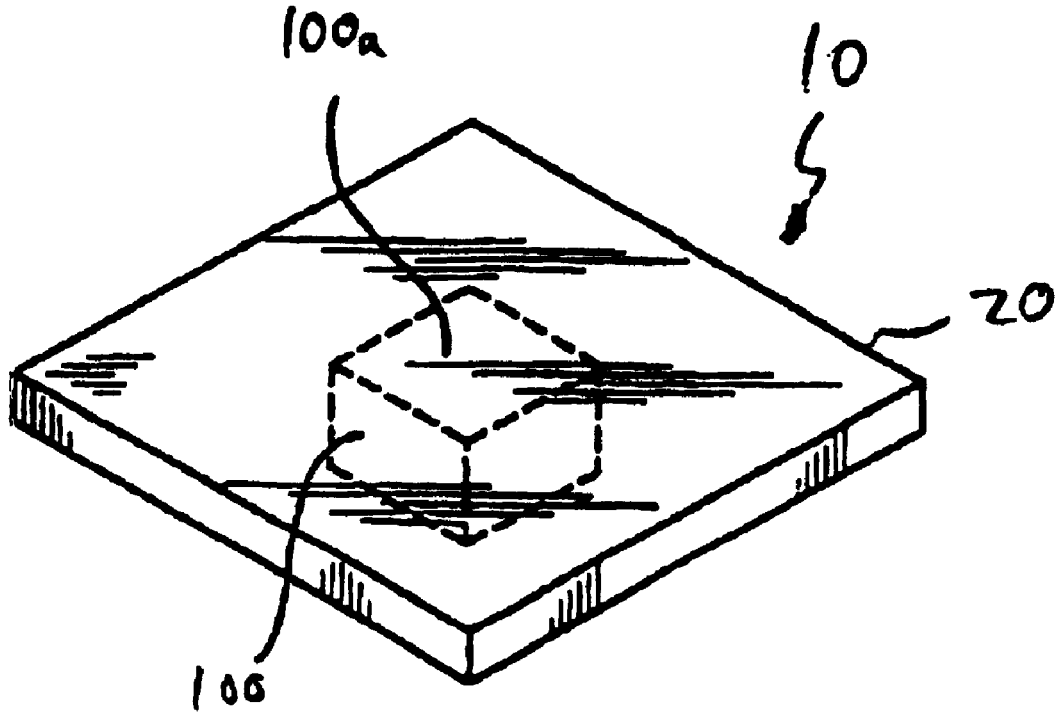

US 6,482,520 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 6, 10, 16 and 19 are cancelled.

Claims 1, 3, 7, 11, 13, 17 and 20 are determined to be patentable as amended.

Claims 2, 4, 5, 8, 9, 12, 14, 15 and 18, dependent on an amended claim, are determined to be patentable.

New claims 21–29 are added and determined to be patentable.

1. A thermal management system comprising a heat source having an external surface and [a thermal interface which comprises] an anisotropic flexible graphite sheet formed [by compressing exfoliated] *of compressed* particles of *exfoliated* natural graphite and having a planar area greater than the area of the external surface of the heat source, the flexible graphite sheet having first and second major planar surfaces and having axes of higher thermal conductivity parallel to said major planar surfaces *such that the ratio of thermal conductivity of the flexible graphite sheet parallel to said major planar surfaces to the thermal conductivity of the flexible graphite sheet transverse to said major surfaces is at least about 20*, one of said major planar surfaces being in direct operative contact with the heat source.

3. A thermal management system comprising a heat sink which comprises a graphite article *comprising a material selected from the group consisting of compressed particles of exfoliated graphite and high density graphite formed from finely divided carbonaceous particles,* shaped so as to provide a heat collection surface and at least one heat dissipation surface, and said system further comprising a thermal interface operatively connected to the heat sink, the thermal interface comprising an anisotropic flexible graphite sheet having two parallel planar surfaces extending in a direction parallel to the planar direction of the crystal structure of the graphite in the sheet, wherein arranging the heat collection surface of the graphite article in direct operative contact with one of said planar surfaces and arranging the other of said planar surfaces in direct operative contact with a heat source causes dissipation of heat from the heat source through the at least one heat dissipation surface of the graphite article.

7. The thermal management system of claim [6] *3* wherein the graphite article comprises anisotropic flexible sheets of compressed particles of exfoliated graphite laminated into a unitary article.

11. The thermal management system of claim [10] *3* wherein the carbonaceous particles have a particle size of less than about 100 mesh.

13. A thermal management system comprising:
(a) a heat source which comprises an electronic component, the heat source having an external surface;
(b) a thermal interface comprising an anisotropic flexible graphite sheet having two parallel planar surfaces extending in a direction parallel to the planar direction of the crystal structure of the graphite in the sheet, a first of the planar surfaces of the thermal interface being in operative contact with the external surface of the heat source, wherein the planar area of the first planar surface of the thermal interface is greater than the area of the external surface of the heat source; and
(c) a heat sink which comprises a graphite article, *wherein the graphite article comprises a material selected from the group consisting of compressed particles of exfoliated graphite and high density graphite formed from finely divided carbonaceous particles,* shaped so as to provide a heat collection surface and at least one heat dissipation surface, the heat collection surface of the heat sink being in operative contact with the second of the planar surfaces of the thermal interface.

17. The thermal management system of claim [16] *13* wherein the graphite article comprises anisotropic flexible sheets of compressed particles of exfoliated graphite laminated into a unitary article.

20. The thermal management system of claim [19] *13* wherein the carbonaceous particles have a particle size of less than 100 mesh.

*21. The thermal management system of claim 1 wherein the contact pressure between the flexible graphite sheet and the heat source is less than 50 psi.*

*22. The thermal management system of claim 1 wherein the surface area of the flexible graphite sheet is at least twice the surface area of the external surface of the heat source.*

*23. The thermal management system of claim 22 wherein the surface area of the flexible graphite sheet is at least four times the surface area of the external surface of the heat source.*

*24. A thermal management system comprising a heat source having an external surface and an anisotropic flexible graphite sheet formed of compressed particles of exfoliated natural graphite and having a planar area greater than the area of the external surface of the heat source, the flexible graphite sheet having first and second major planar surfaces and having axes of higher thermal conductivity parallel to said major planar surfaces, one of said major planar surfaces being in operative contact with the heat source.*

*25. The thermal management system of claim 24 wherein the ratio of thermal conductivity of the flexible graphite sheet parallel to said major planar surfaces to the thermal conductivity of the flexible graphite sheet transverse to said major surfaces is at least about 20.*

*26. The thermal management system of claim 24 wherein the contact pressure between the flexible graphite sheet and the heat source is less than 50 psi.*

*27. The thermal management system of claim 24 wherein the heat source comprises an electronic component.*

*28. The thermal management system of claim 24 wherein the surface area of the flexible graphite sheet is at least twice the surface area of the external surface of the heat source.*

*29. The thermal management system of claim 28 wherein the surface area of the flexible graphite sheet is at least twice the surface area of the external surface of the heat source.*

\* \* \* \* \*

(12) EX PARTE REEXAMINATION CERTIFICATE (6646th)
United States Patent
Tzeng

(10) Number: US 6,482,520 C2
(45) Certificate Issued: Feb. 3, 2009

(54) THERMAL MANAGEMENT SYSTEM

(75) Inventor: Jing Wen Tzeng, Brunswick, OH (US)

(73) Assignee: Advanced Energy Technology Inc., Lakewood, OH (US)

Reexamination Request:
No. 90/008,774, Jul. 24, 2007

Reexamination Certificate for:
Patent No.: 6,482,520
Issued: Nov. 19, 2002
Appl. No.: 09/513,001
Filed: Feb. 25, 2000

Reexamination Certificate C1 6,482,520 issued Nov. 13, 2007

Certificate of Correction issued Mar. 4, 2003.

(51) Int. Cl.
*H01L 21/48* (2006.01)
*H01L 21/02* (2006.01)
*H01L 23/34* (2006.01)
*H01L 23/373* (2006.01)

(52) U.S. Cl. .................. 428/408; 428/131; 361/709; 165/905; 165/907; 257/712; 257/722; 257/E23.11; 257/E23.112; 423/414; 423/445 R; 423/448

(58) Field of Classification Search .................... None
See application file for complete search history.

(56) References Cited

U.S. PATENT DOCUMENTS

| 4,471,837 | A | 9/1984 | Larson |
| 5,100,737 | A | 3/1992 | Colombier et al. |
| 5,192,605 | A | 3/1993 | Mercuri et al. |
| 5,991,155 | A | 11/1999 | Kobayashi et al. |
| 6,257,328 | B1 | 7/2001 | Fujiwara et al. |

FOREIGN PATENT DOCUMENTS

| EP | 0 691 803 A1 | 1/1996 |
| JP | 10-056114 | 2/1998 |
| WO | 99/46437 | 9/1999 |

OTHER PUBLICATIONS

"Ullmann's Encyclopedia of Industrial Chemistry", vol. 45, 1986, pp. 123–124.
Digital Semiconductor 21164 Alpha Microprocessor Motherboard User's Manual, Mar. 1996, pp. 3–4.

*Primary Examiner*—Stephen J Stein

(57) ABSTRACT

The present invention relates to a system for managing the heat from a heat source like an electronic component. More particularly, the present invention relates to a system effective for dissipating the heat generated by an electronic component using a thermal management system that includes a thermal interface formed from a flexible graphite sheet and/or a heat sink formed from a graphite article.

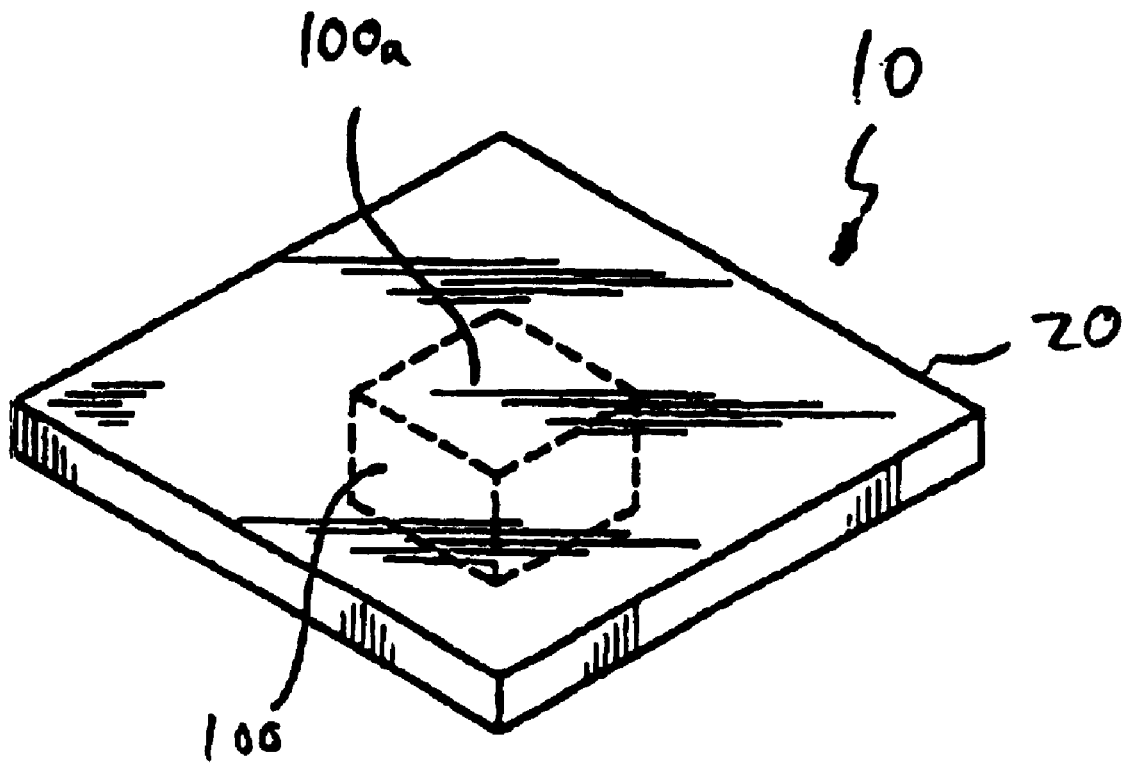

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–5, 7–9, 11–15, 17, 18 and 20–23 is confirmed.

Claims 6, 10, 16 and 19 were previously cancelled.

Claim 25 is cancelled.

Claim 24 is determined to be patentable as amended.

Claims 26–29, dependent on an amended claim, are determined to be patentable.

24. A thermal management system comprising a heat source having an external surface and an anisotropic flexible graphite sheet formed of compressed particles of exfoliated natural graphite and having a planar area greater than the area of the external surface of the heat source, the flexible graphite sheet having first and second major planar surfaces and having axes of higher thermal conductivity parallel to said major planar surfaces *wherein the ratio of thermal conductivity of the flexible graphite sheet parallel to said major planar surfaces to the thermal conductivity of the flexible graphite sheet transverse to said major planar surfaces is at least about 20*, one of said major planar surfaces being in operative contact with the heat source.

29. The thermal management system of claim 28 wherein the surface area of the flexible graphite sheet is at least [twice] *four times* the surface area of the external surface of the heat source.

\* \* \* \* \*